United States Patent
Ko et al.

(10) Patent No.: US 8,275,008 B2
(45) Date of Patent: Sep. 25, 2012

(54) WAVELENGTH TUNABLE SEMICONDUCTOR LASER APPARATUS

(75) Inventors: Hyun Sung Ko, Seoul (KR); Chul Huh, Daejeon (KR); Kyung Hyun Kim, Daejeon (KR); Jong Cheol Hong, Daejeon (KR); Wan Joong Kim, Gyunggi-Do (KR); Gun Yong Sung, Daejeon (KR); Seon Hee Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 164 days.

(21) Appl. No.: 12/745,514

(22) PCT Filed: Apr. 2, 2008

(86) PCT No.: PCT/KR2008/001854
§ 371 (c)(1),
(2), (4) Date: May 28, 2010

(87) PCT Pub. No.: WO2009/075413
PCT Pub. Date: Jun. 18, 2009

(65) Prior Publication Data
US 2010/0309937 A1    Dec. 9, 2010

(30) Foreign Application Priority Data
Dec. 13, 2007 (KR) .................. 10-2007-0130079

(51) Int. Cl.
*H01S 3/10* (2006.01)
(52) U.S. Cl. ........................... 372/20; 372/23
(58) Field of Classification Search .................... 372/20, 372/23
See application file for complete search history.

(56) References Cited

U.S. PATENT DOCUMENTS

| 5,173,909 | A * | 12/1992 | Sakano et al. ................ 372/20 |
| 5,473,625 | A | 12/1995 | Hansen et al. |
| 5,536,085 | A | 7/1996 | Li et al. |
| 5,976,903 | A | 11/1999 | Lee et al. |
| 6,665,457 | B2 | 12/2003 | Lundqvist |
| 6,700,910 | B1 | 3/2004 | Aoki et al. |
| 6,768,577 | B2 | 7/2004 | Eggleton et al. |
| 6,865,214 | B2 | 3/2005 | Kim |
| 7,564,196 | B2 | 7/2009 | Shiwaya et al. |

(Continued)

FOREIGN PATENT DOCUMENTS
JP    62-269377    11/1987
(Continued)

OTHER PUBLICATIONS

Blau, G. et al., "Tunable VCSEL with integrated heater and planar waveguide wavelength monitor," IEEE/LEOS International Conference on Optical MEMS, pp. 83-84 (2000).

(Continued)

*Primary Examiner* — Kinam Park
(74) *Attorney, Agent, or Firm* — Nelson Mullins Riley & Scarborough LLP; EuiHoon Lee, Esq.

(57) ABSTRACT

A semiconductor laser apparatus is provided which can vary an output wavelength of a light source. A semiconductor laser diode and one or more heat source devices arranged around the semiconductor laser diode are integrated on one substrate. The semiconductor laser diode is configured to be uniformly heated by the heat source device. An output wavelength of the semiconductor laser diode can be easily and quickly varied.

11 Claims, 8 Drawing Sheets

U.S. PATENT DOCUMENTS

| | | | |
|---|---|---|---|
| 2003/0139060 A1* | 7/2003 | Sai | 438/767 |
| 2005/0013331 A1* | 1/2005 | Kish et al. | 372/32 |
| 2006/0039658 A1* | 2/2006 | Furuyama et al. | 385/90 |

FOREIGN PATENT DOCUMENTS

| | | |
|---|---|---|
| JP | 1-173686 | 7/1989 |
| JP | 1-225187 | 9/1989 |
| JP | 2-197184 | 8/1990 |
| JP | 4-229681 | 8/1992 |
| JP | 10-321950 | 12/1998 |
| JP | 2006-114774 | 4/2006 |
| JP | 2006-190758 | 7/2006 |
| JP | 2008-236869 | 10/2008 |
| KR | 1999-021361 | 3/1999 |

OTHER PUBLICATIONS

Fan, L. et al., "10.1nm range continuous wavelength-tunable vertical-cavity surface-emitting lasers," Electronics Letters, vol. 30(17):1409-1410 (1994).

Sakano, Shinji et al., "Tunable DFB Laser with a Striped Thin-Film Heater," IEEE Photonics Technology Letters, vol. 4 (4):321-323 (1992).

* cited by examiner

WAVELENGTH TUNABLE SEMICONDUCTOR LASER APPARATUS

RELATED APPLICATIONS

This application is a 35 U.S.C. §371 national stage filing of PCT Application No. PCT/KR2008/001854 filed on Apr. 2, 2008, which claims priority to, and the benefit of, Korean Patent Application No. 10-2007-0130079 filed on Dec. 13, 2007. The contents of the aforementioned applications are hereby incorporated by reference.

TECHNICAL FIELD

The present invention relates to a semiconductor laser apparatus capable of varying an output wavelength of a light source, and more particularly, to a wavelength tunable semiconductor laser apparatus capable of varying an output wavelength by arranging one or more heat source devices around a semiconductor laser diode to be uniformly heated.

The work related to the present invention was supported by the IT R&D program of MIC/IITA [2006-S-007-02, Title: Ubiquitous Health Monitoring Module and System Development].

BACKGROUND ART

A wavelength tunable laser is a laser capable of adjusting an emission wavelength. This wavelength tunable laser is used for a light source for optical communications, gas sensors, biosensors, and the like. The wavelength tunable laser to be used for optical communications, various sensors, and the like should have a wide wavelength tuning range, high output power, fast wavelength tuning rate and low cost.

Wavelength tuning methods for use in the wavelength tunable laser are a method using a vertical cavity surface-emitting laser (VCSEL) and a micro-electro-mechanical system (MEMS), a method using an external cavity laser with an external resonator, a method using a hot wire, a method using a distributed Bragg reflector (DBR) laser, and the like.

Among these methods, the method using the MEMS adjusts an output wavelength by changing a cavity length by using an MEMS technique. This method is advantageous in that a wavelength tuning range is wide and a wavelength is continuously tunable, but is disadvantageous in that a wavelength tuning rate is slow and stability is problematic upon long time use.

The method using the external resonator changes an output wavelength of a laser by mounting a wavelength selection mechanism of a prism or grating in the resonator including a laser and a mirror and moving the wavelength selection mechanism. Using this method, the wavelength tunable laser is advantageous in that an output power is large, an output light line width is narrow, a wavelength tunable range is wide, and a wavelength is continuously tunable, but is disadvantageous in that a wavelength tuning rate is slow and stability of a mechanical drive device is problematic.

The method using the hot wire changes an output wavelength by mounting the hot wire on a laser and adjusting a temperature of the laser using the hot wire. When a distributed feedback (DFB) laser is used in the method using the hot wire, a wavelength tuning coefficient according to a temperature is about 0.1 nm/C. When the DFB laser is used, a wavelength tuning width available in one DFB laser is limited. For this reason, there is a problem in that multiple DFB lasers are required when a large wavelength tuning width is required.

Figure 1:
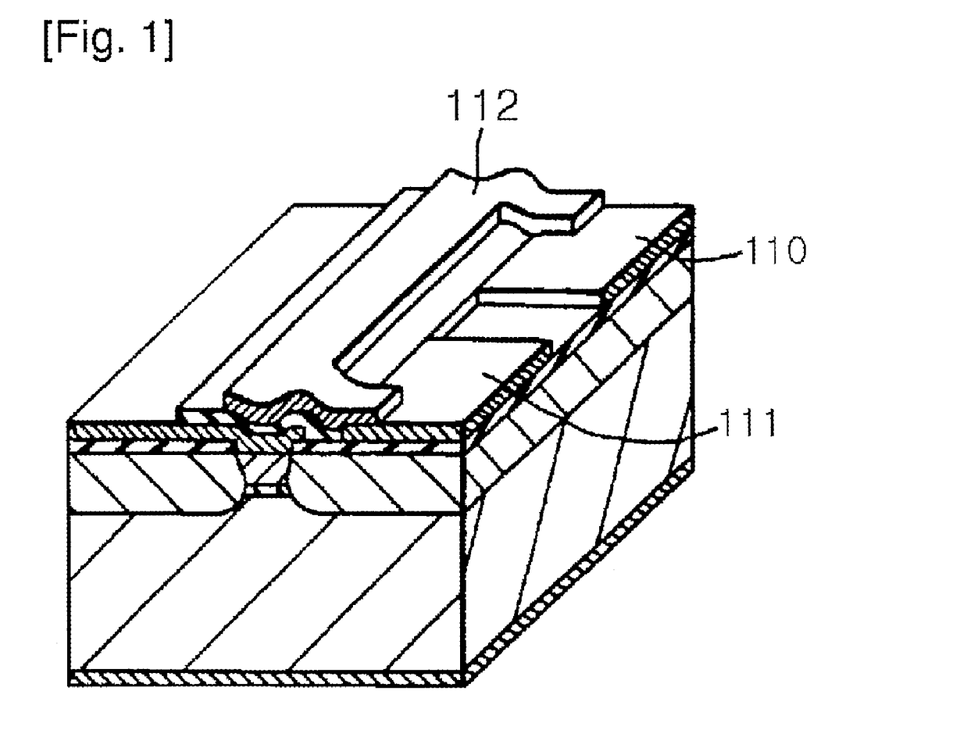
FIG. 1 is a view illustrating an embodiment of a conventional wavelength tunable laser apparatus using a hot wire.

FIG. 1 is a view illustrating an embodiment of a conventional wavelength tunable laser diode using a hot wire. Referring to FIG. 1, a hot wire heater 112 and electrodes 110 and 111 of the hot wire heater 112 are deposited on a laser diode surface. That is, the hot wire is connected to a power supply and an emission wavelength is changed by heating a laser diode with the heat emitted from the hot wire. The hot-wire type DFB laser manufactured in this method is currently being commercialized. This method is advantageous in that a wavelength is continuously tunable and a structure is simple, and a production is easy, but is disadvantageous in that a wavelength tuning rate is slow.

On the other hand, the DBR laser is mainly configured with a gain region, a grating region and a phase region. Each region is driven using a separate current source, a carrier concentration varies with a current across each region, and an emission wavelength is changed by a variation of a refractive index based on the carrier concentration variation. This method may not continuously vary a wavelength. In order to obtain the specific wavelength light, a current corresponding to a desired wavelength should be provided by inspecting in advance an output wavelength based on a current across each region and creating its table. This method is disadvantageous in that it is complex to control a wavelength.

DISCLOSURE OF INVENTION

Technical Problem

As described above, the wavelength tuning methods of the conventional wavelength tunable laser are disadvantageous in that a wavelength tunable rate is slow, a control method for obtaining a desired wavelength is complex, and stability is problematic upon long time use. Accordingly, an aspect of the present invention provides a wavelength tunable semiconductor laser apparatus that can easily and quickly change an output wavelength of a semiconductor laser diode.

Technical Solution

According to an aspect of the present invention, there is provided a wavelength tunable semiconductor laser apparatus including: a semiconductor laser diode for emitting light; a first power supply for supplying a current to the semiconductor laser diode; at least one heat source device arranged on the same substrate along with the semiconductor laser diode to act as a heat source; and at least one second power supply for supplying power to the at least one heat source device.

The at least one heat source device may be a semiconductor device having a structure formed on the same substrate along with the semiconductor laser diode to generate heat, and the at least one heat source device is a semiconductor device having the same structure as the semiconductor laser diode.

The at least one second power supply may be connected to the at least one heat source device in one to one correspondence.

The semiconductor laser diode may be a surface-emitting type semiconductor laser diode.

The at least one heat source device may be formed within a given radius of the surface-emitting type semiconductor laser diode and may be located immediately adjacent to an active region of the surface-emitting type semiconductor laser diode.

The at least one heat source device may prevent light from being emitted by covering a light emitting surface with an electrode or an opaque film, or by covering a portion of the light emitting surface with the electrode and covering the remaining portion with the opaque film.

The semiconductor laser diode may be an edge-emitting type semiconductor laser diode.

The at least one heat source device may be arranged on at least one side or both side of the semiconductor laser diode.

The at least one heat source device may be warped and formed to have a light output direction different from that of the semiconductor laser diode on the same substrate as that of the semiconductor laser diode.

The at least one heat source device may have a light emitting surface formed at a slant such that a light emitting direction thereof is different from that of the semiconductor laser diode.

Advantageous Effects

According to the present invention compared to a conventional method using a hot wire, an output wavelength can be more easily changed and a wavelength tuning rate is faster.

BRIEF DESCRIPTION OF THE DRAWINGS

The above and other aspects, features and other advantages of the present invention will be more clearly understood from the following detailed description taken in conjunction with the accompanying drawings, in which.

BEST MODE FOR CARRYING OUT THE INVENTION

Hereinafter, exemplary embodiments of the present invention will now be described in detail with reference to the accompanying drawings.

Descriptions of well-known functions and constructions are omitted for clarity and conciseness.

In the drawings, the same or similar elements are denoted by the same reference numerals even though they are depicted in different drawings.

Figure 2:
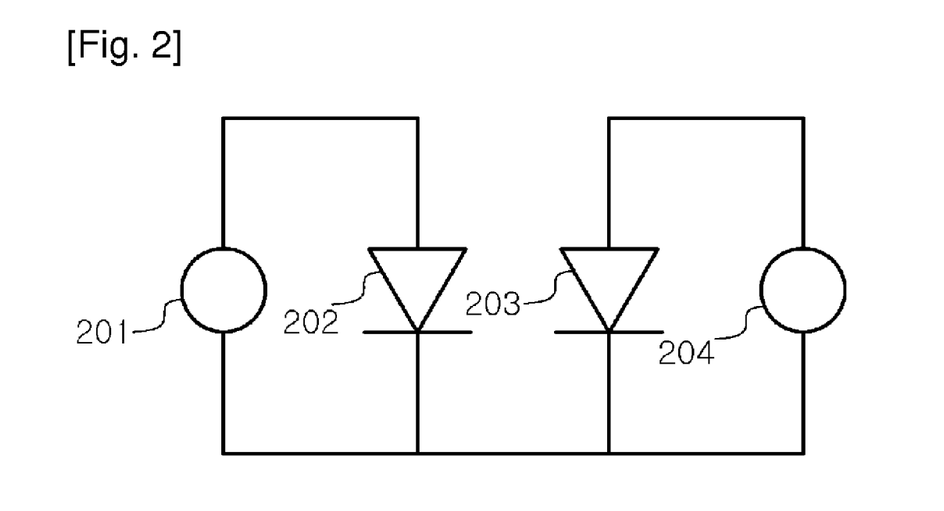
FIG. 2 is a view illustrating a wavelength tunable semiconductor laser diode according to a first exemplary embodiment of the present invention.

FIG. 2 is a view illustrating a wavelength tunable semiconductor laser apparatus according to a first exemplary embodiment of the present invention. Referring to FIG. 2, the wavelength tunable semiconductor laser apparatus has a structure in which one semiconductor laser diode 203 used as a light source and one heat source device 202 used as a heat source are parallel integrated on the same substrate, and includes a first power supply 201 for supplying a current to the heat source device 202 and a second power supply 204 for supplying a current to the semiconductor laser diode 203.

The heat source device 202 and the semiconductor laser diode 203 individually operate using the different power supplies and are electrically separated from each other.

The heat source device 202 is a semiconductor device formed on the same substrate along with the semiconductor laser diode 203 or a semiconductor device of an arbitrary structure capable of generating heat formed on the same substrate along with the semiconductor laser diode. The heat generated from the heat source device 202 is transferred to the semiconductor laser diode 203 and is used to change an output light wavelength of the semiconductor laser diode 203.

Additionally, in the case of a hot-wire type wavelength tunable laser diode, a laser diode is heated and an output light wavelength of the laser diode is changed using a hot wire (heater) made of Ti or the like formed on the laser diode surface. However, the present invention uses a semiconductor device of a semiconductor diode or the like as a heat source device. In the present invention, an output light wavelength of the semiconductor laser diode or the like can be changed using the heat source device in place of the hot wire since the semiconductor device of the semiconductor diode or the like independently generates the heat when a current flows.

The first power supply 201 functions as a wavelength controller that adjusts the heat to be generated by adjusting a current amount to be supplied to the heat source device 202 to thereby change an output light wavelength of the semiconductor laser diode 203.

Figure 3:
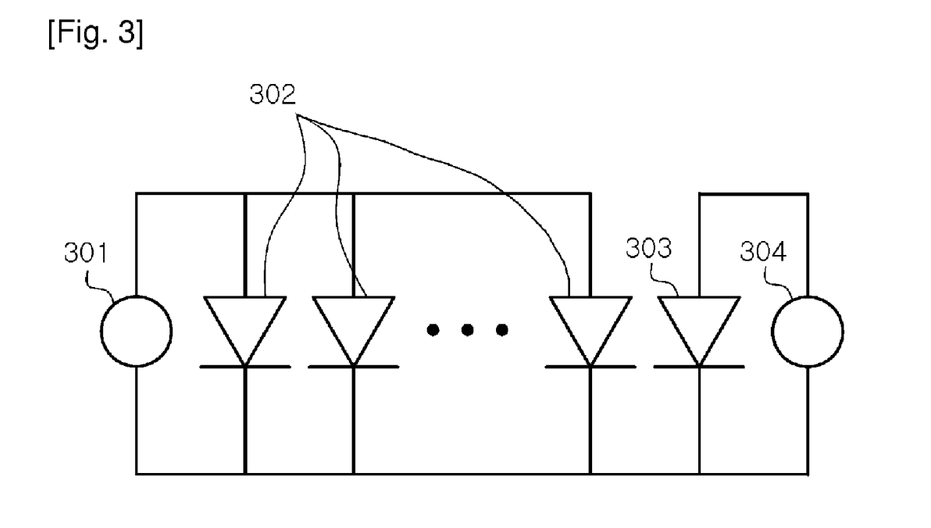
FIG. 3 is a view illustrating a structure of a wavelength tunable semiconductor laser apparatus according to a second exemplary embodiment of the present invention.

FIG. 3 is a view illustrating a structure of a wavelength tunable semiconductor laser apparatus according to a second exemplary embodiment of the present invention. Referring to FIG. 3, the wavelength tunable semiconductor laser apparatus of the present invention has a structure of varying a wavelength of a semiconductor laser diode 303 by heating multiple heat source devices 302 by using one first power supply 301 formed on one substrate.

Specifically, the multiple heat source devices 302 are connected to the first power supply 301, wherein the semiconductor laser diode 303 is parallel arranged and one second power supply 304 is connected to the semiconductor laser diode 303.

Herein, the multiple heat source devices 302 and the semiconductor laser diode 303 are integrated on the same substrate, and the heat source devices 302 and the semiconductor laser diode 303 individually operate using the different power supplies and are electrically separated from each other.

The heat source devices 302 are semiconductor devices of the same structure formed on the same substrate along with the semiconductor laser diode 303 or semiconductor devices of an arbitrary structure capable of generating heat formed on the same substrate along with the semiconductor laser diode. The semiconductor laser diode 303 can be effectively heated by symmetrically arranging the heat source devices 302 around the semiconductor laser diode 303. The number of heat source devices 302 is not limited.

Figure 4:
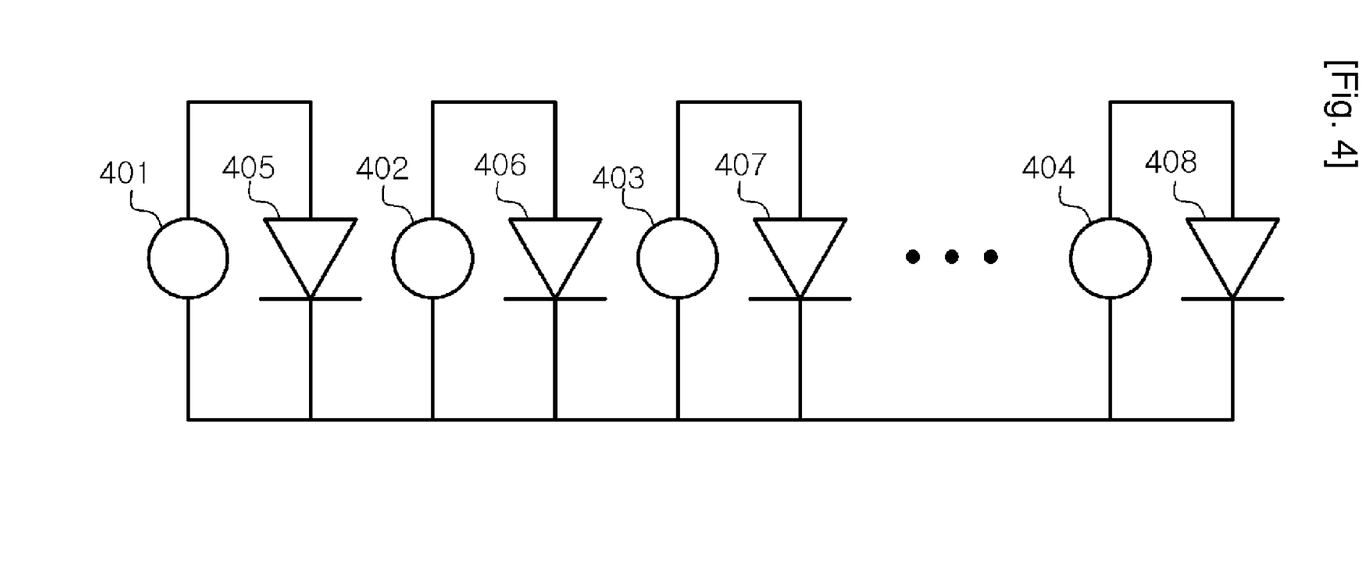
FIG. 4 is a view illustrating a structure of a wavelength tunable semiconductor laser apparatus according to a third exemplary embodiment of the present invention.

FIG. 4 is a view illustrating a structure of a wavelength tunable semiconductor laser apparatus according to a third exemplary embodiment of the present invention. Referring to FIG. 4, the wavelength tunable semiconductor laser apparatus of the present invention has a structure in which multiple heat source devices 405, 406 and 407 are used and the heat source devices 405, 406 and 407 are connected to separate power supplies 401, 402, 403 and 404 and are symmetrically parallel connected to a semiconductor laser diode 408. The semiconductor laser diode 408 is connected to a separate power supply 404.

Herein, the multiple heat source devices 405, 406 and 407 and the semiconductor laser diode 408 are integrated on the same substrate. The multiple heat source devices 405, 406 and 407 and the semiconductor laser diode 408 individually operate using the different power supplies 401, 402 and 403, and are electrically separated from each other.

The heat source devices 405, 406 and 407 are semiconductor devices of the same structure formed on the same substrate along with the semiconductor laser diode 203 or semiconductor devices of an arbitrary structure capable of generating heat formed on the same substrate along with of the semiconductor laser diode. The number of heat source devices is not limited. That is, one or more heat source devices are arranged around the semiconductor laser diode to uniformly heat the semiconductor laser diode and vary an output wavelength.

Figure 5:
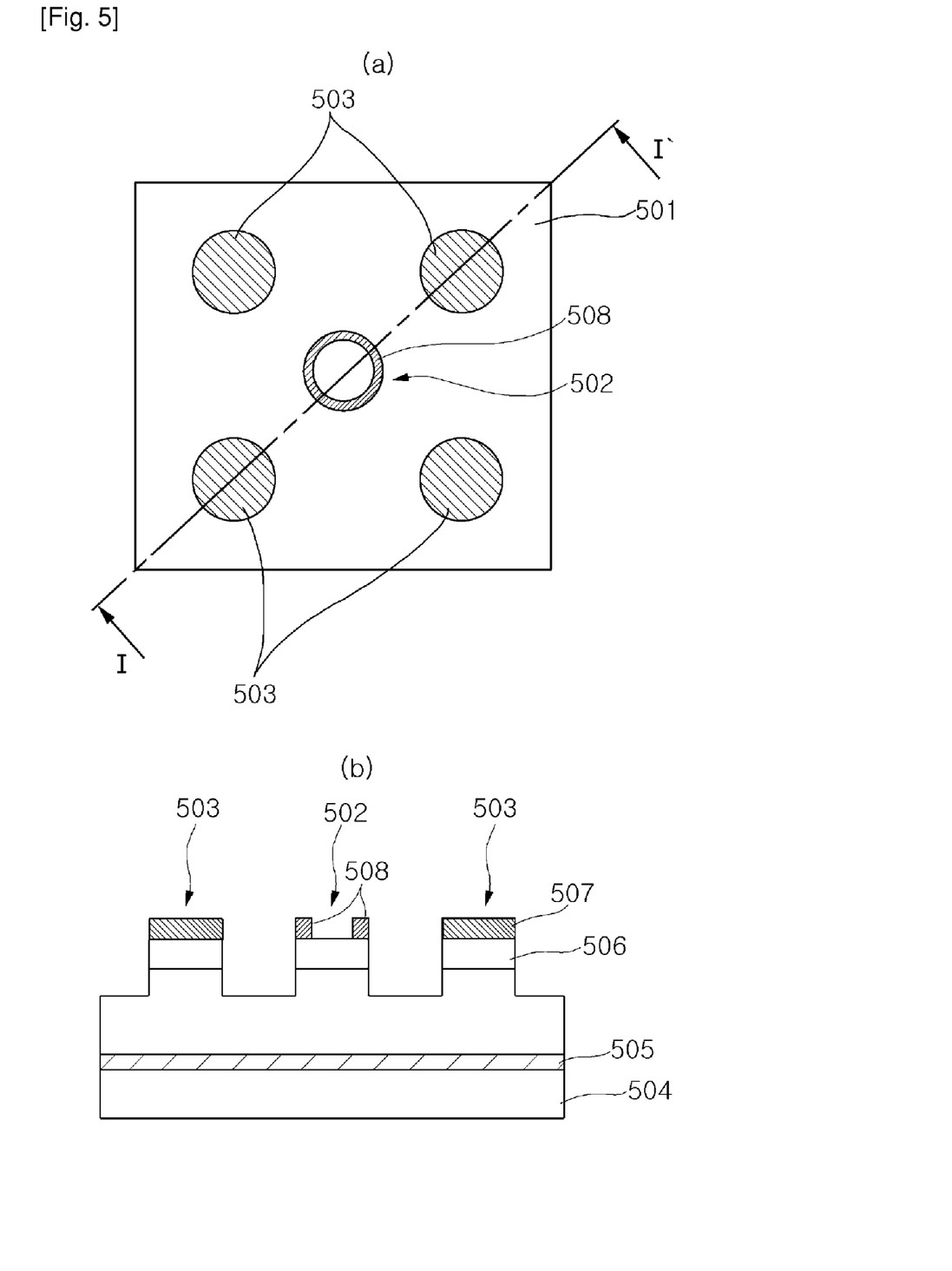
FIG. 5 is a view illustrating a structure of a wavelength tunable semiconductor laser diode using a surface-emitting type semiconductor laser apparatus according to a fourth exemplary embodiment of the present invention.

FIG. 5 is a view illustrating a structure of a wavelength tunable semiconductor laser apparatus using a surface-emitting type semiconductor laser according to a fourth exemplary embodiment of the present invention.

(a) Of FIG. 5 illustrates a perspective view of a wavelength tunable semiconductor laser apparatus using a surface emitting laser according to the fourth exemplary embodiment of the present invention. Referring to (a) Of FIG. 5, the wavelength tunable semiconductor laser apparatus includes a surface-emitting type semiconductor laser diode 502 and four heat source devices 503 formed on a substrate 501. The four heat source devices 503 are separated at given intervals and are arranged around the surface-emitting type semiconductor laser diode 502.

The four heat source devices 503 are surface-emitting type semiconductor diodes like the surface-emitting type semiconductor laser diode 502, and a light emitting surface of the multiple heat source devices 503 is covered with an electrode or the like and only a light emitting surface of the semiconductor laser diode is exposed.

A structure in which the four heat source devices 503 are arranged around the surface-emitting type semiconductor laser diode 502 in the present invention has been described, but one or more heat source devices can be arranged. When the multiple heat source devices are arranged at given intervals around the surface-emitting type semiconductor laser diode, the surface-emitting type semiconductor laser diode can be more uniformly heated in comparison with the case where one heat source device is used.

Moreover, the case where the four heat source devices 503 are surface-emitting type semiconductor diodes like the surface-emitting type semiconductor laser diode 502 has been illustrated, but the heat source devices can be formed on the same substrate along with the surface-emitting type semiconductor laser diode and a semiconductor device of an arbitrary structure capable of generating the heat can be sufficiently used therefor.

(b) Of FIG. 5 is a cross-sectional view taken along the line I-I' of the wavelength tunable semiconductor laser apparatus using a surface emitting laser (a) Of FIG. 5. Referring to (b) of FIG. 5, the wavelength tunable semiconductor laser apparatus of the present invention includes a lower DBR 505 and an upper DBR 506 formed on a substrate 504. An electrode 508 of the semiconductor laser diode 502 is exposed to emit the light. An electrode 507 of the heat source device 503 covers the heat source device 503 to prevent light from being emitted. Herein, an opaque film can be used in place of the electrode, or a portion can use the electrode and the remaining portion can use the opaque film to cover the emitting surface of the heat source device 503.

In addition, the case where the present invention is applied to a hot-wire type wavelength tunable surface emitting laser will be described by comparing the surface-emitting type wavelength tunable semiconductor laser apparatus and the hot-wire type wavelength tunable surface emitting laser.

The hot-wire type wavelength tunable surface emitting laser has a structure in which a hot wire is attached to a surface and has a structure in which a wavelength is changed by heating a surface emitting laser using the heat generated from the hot wire. However, the surface-emitting type semiconductor diode has a structure in which DBR mirrors are layered using semiconductors on upper and lower parts.

When the hot wire is placed in the outside region in this structure, the heat is to pass through the DBR minor of the upper part to transfer the heat to an active region of the surface-emitting type semiconductor laser diode. Since the thermal conductivity of the DBR mirror of the surface-emitting type semiconductor laser diode is low, the thermal conductivity efficiency is lowered and the transfer of the heat generated from the hot wire to the active region is time-consuming.

Accordingly, when the surface-emitting type wavelength tunable semiconductor laser apparatus according to the present invention is applied to the hot-wire type wavelength tunable surface emitting laser, it can more quickly and effectively vary a wavelength than the hot wire type since the heat source device is located immediately adjacent to the active region of the surface-emitting type semiconductor laser diode.

Figure 6:
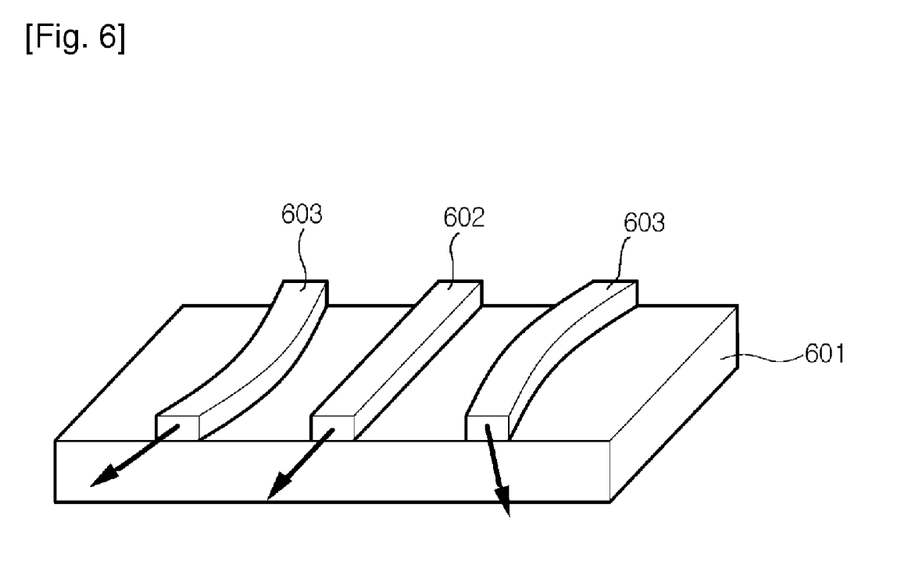
FIG. 6 is a view illustrating a structure of an edge-emitting type wavelength tunable semiconductor laser apparatus according to a fifth exemplary embodiment of the present invention.

FIG. 6 is a view illustrating a structure in which a heat source device is integrated on one or both sides of an edge-emitting type wavelength tunable semiconductor laser diode in an edge-emitting type wavelength tunable semiconductor laser apparatus according to a fifth exemplary embodiment of the present invention.

Referring to FIG. 6, the edge-emitting type wavelength tunable semiconductor laser apparatus of the present invention include heat source devices 603 formed on both sides of the edge-emitting type semiconductor laser diode 602 on a substrate 601.

The heat source device 603 can be only formed on one side of the semiconductor laser diode 602, and its length does not need to be the same as the semiconductor laser diode 602 since it does not function as a light source.

In the case of the edge-emitting type wavelength tunable semiconductor laser diode, it is difficult to cover only a light emitting surface of the heat source device 603 and expose an emitting surface of the semiconductor laser diode 602. A resonator of the heat source device 603 is warped as illustrated in FIG. 6, such that a direction of light emitted from the heat source device 603 is different from that of light emitted from the semiconductor laser diode 602.

Figure 7:
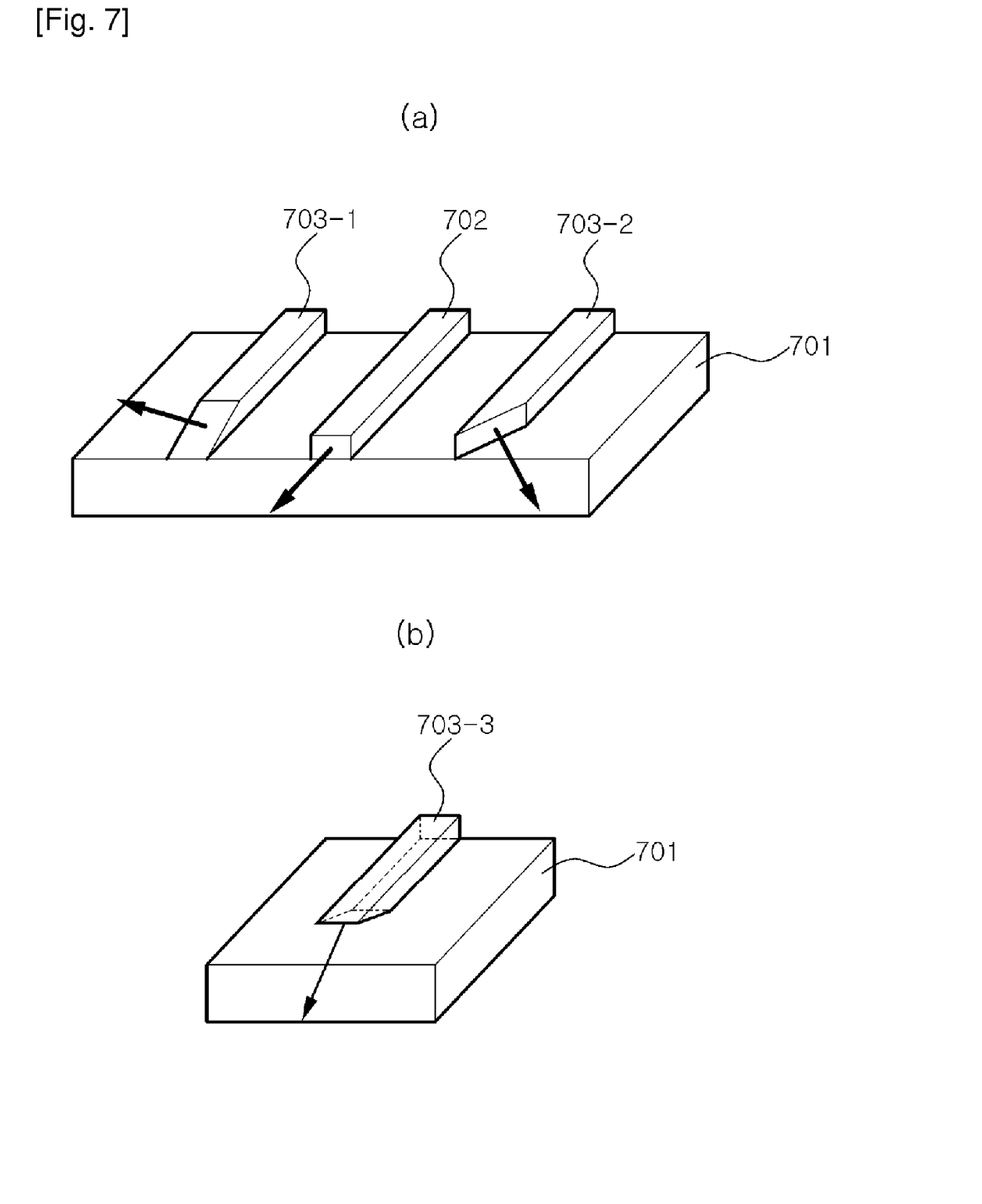
FIG. 7 is a view illustrating a structure of an edge-emitting type wavelength tunable semiconductor laser apparatus according to a sixth exemplary embodiment of the present invention.

FIG. 7 is a view illustrating a structure of an edge-emitting type wavelength tunable semiconductor laser apparatus according to a sixth exemplary embodiment of the present invention. (a) of FIG. 7 illustrates a structure in which heat source devices 703-1 and 703-2 are integrated by etching a part of a light emitting surface on one or two sides of the edge-emitting type semiconductor laser diode 702 at a slant, and (b) of FIG. 7 illustrates a heat source device 703-3 whose light emitting surface is etched in a form different from the heat source devices 703-1 and 703-2 illustrated in (a) of FIG. 7.

Referring to (a) of FIG. 7, the edge-emitting type wavelength tunable semiconductor laser apparatus of the present invention includes a part of the heat source devices 703-1 and 703-2 etched at a slant using a method of etching or the like to make a light output direction of the heat source devices 703-1 and 703-2 different from that of the semiconductor laser diode 702.

After the heat source devices 703-1 and 703-2 are etched, a semiconductor substrate 701 is cut, a cut surface is across an etched portion, and the light emitting surface of the semiconductor laser diode 702 is formed at a right angle with respect to the substrate, the light emitting surface of the heat source devices 703-1 and 703-2 is formed at a slant with respect to the substrate, and lights from the heat source devices 703-1 and 703-2 and the semiconductor laser diode 702 are emitted in different directions.

Referring to (b) of FIG. 7, the edge-emitting type wavelength tunable semiconductor laser apparatus of the present invention can use a heat source device 703-3 whose light emitting surface is etched in a shape in which the heat source device 703-1 of (a) of FIG. 7 is reversed.

Accordingly, the wavelength tunable semiconductor laser apparatus of the present invention described with reference to FIGS. 2 to 7 includes a semiconductor laser and a heat source device integrated on a substrate and includes one or more heat source devices formed adjacent to each other so as to effectively transfer the heat generated therefrom to a semiconductor laser diode.

Moreover, the semiconductor laser and the heat source individually operate using different power supplies, and the semiconductor laser diode and the heat source device are electrically separated.

The heat source device other than the semiconductor laser diode does not function as a laser, and functions as only a heat source for generating the heat from a current across the heat source device.

To prevent light from being emitted, a light emitting surface of the heat source device is covered with an electrode or another transmissive material or a light emitting direction is formed to be different from a direction of emitting light from the semiconductor laser diode.

Figure 8:
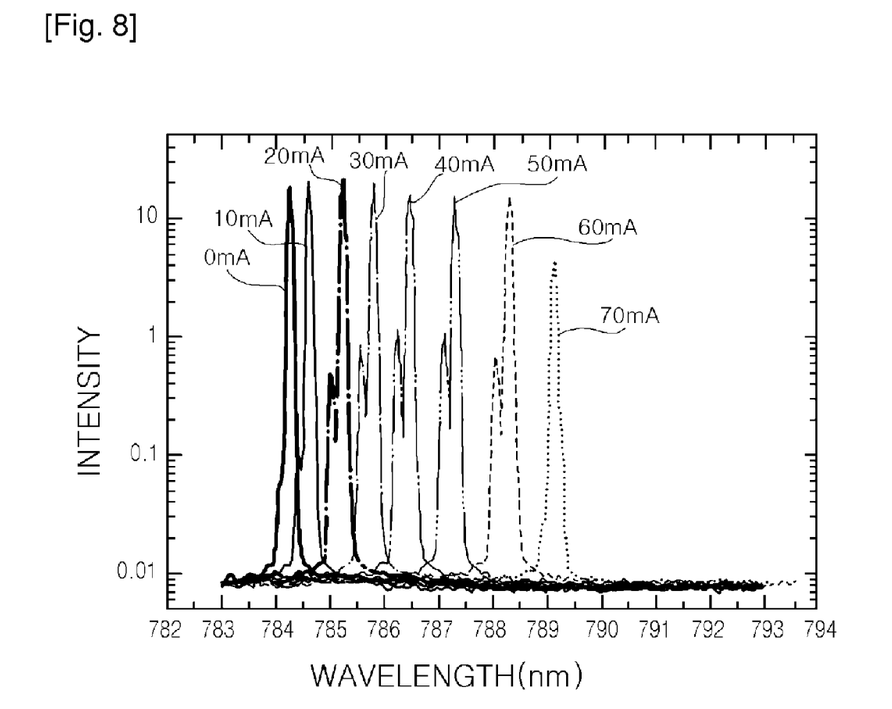
FIG. 8 is a result graph obtained by measuring wavelength tunable characteristics of a surface-emitting type wavelength tunable semiconductor laser apparatus actually manufactured using the wavelength tunable semiconductor laser apparatus illustrated in FIGS. 2 to 7.

FIG. 8 is a result graph obtained by measuring wavelength tunable characteristics of a surface-emitting type wavelength tunable semiconductor laser apparatus actually manufactured using the wavelength tunable semiconductor laser apparatus illustrated in FIGS. 2 to 7. Herein, the wavelength tunable characteristics were measured by varying a current across a hot wire in a unit of 10 mA from 0 mA to 70 mA. Referring to FIG. 8, it can be seen that a wavelength of the semiconductor laser diode varies with a current supplied to a heat source device.

While the present invention has been shown and described in connection with the exemplary embodiments, it will be apparent to those skilled in the art that modifications and variations can be made without departing from the spirit and scope of the invention as defined by the appended claims.

The invention claimed is:

1. A wavelength tunable semiconductor laser apparatus comprising:

a semiconductor laser diode for emitting light;

a first power supply for supplying a current to the semiconductor laser diode, at least one heat source device arranged on the same substrate along with the semiconductor laser diode to act as a heat source; and at least one second power supply for supplying power to the at least one heat source device, wherein the heat source device and the semiconductor laser diode operate individually using the first and second power supplies and are electrically separate from each other, wherein the at least one heat source device is a semiconductor device having a structure formed on the same substrate along with the semiconductor laser diode to generate heat, wherein the at least one heat source device is a semiconductor device having the same structure as the semiconductor laser diode.

2. The wavelength tunable semiconductor laser apparatus of claim 1, wherein the at least one second power supply is connected to the at least one heat source device in one to one correspondence.

3. The wavelength tunable semiconductor laser apparatus of claim 1, wherein the semiconductor laser diode is a surface-emitting type semiconductor laser diode.

4. The wavelength tunable semiconductor laser apparatus of claim 3, wherein the at least one heat source device is formed within a given radius of the surface-emitting type semiconductor laser diode and is located immediately adjacent to an active region of the surface-emitting type semiconductor laser diode.

5. The wavelength tunable semiconductor laser apparatus of claim 4, wherein the at least one heat source device prevents light from being emitted by covering a light emitting surface with an electrode.

6. The wavelength tunable semiconductor laser apparatus of claim 4, wherein the at least one heat source device prevents light from being emitted by covering a light emitting surface with an opaque film.

7. The wavelength tunable semiconductor laser apparatus of claim 4, wherein the at least one heat source device prevents light from being emitted by covering a portion of a light emitting surface with an electrode and covering the remaining portion with an opaque film.

8. The wavelength tunable semiconductor laser apparatus of claim 1, wherein the semiconductor laser diode is an edge-emitting type semiconductor laser diode.

9. The wavelength tunable semiconductor laser apparatus of claim 8, wherein the at least one heat source device is arranged on at least one side or both side of the semiconductor laser diode.

10. The wavelength tunable semiconductor laser apparatus of claim 9, wherein the at least one heat source device is warped and formed on the same substrate along with the semiconductor laser diode to have a light output direction different from that of the semiconductor laser diode.

11. The wavelength tunable semiconductor laser apparatus of claim 9, wherein the at least one heat source device has a light emitting surface formed at a slant such that a light emitting direction thereof is different from that of the semiconductor laser diode.

* * * * *